United States Patent
Namuduri et al.

(10) Patent No.: US 11,476,507 B2
(45) Date of Patent: Oct. 18, 2022

(54) SOLID-STATE MULTI-SWITCH DEVICE

(71) Applicant: GM GLOBAL TECHNOLOGY OPERATIONS LLC, Detroit, MI (US)

(72) Inventors: Chandra S. Namuduri, Troy, MI (US); Rashmi Prasad, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 142 days.

(21) Appl. No.: 16/819,872

(22) Filed: Mar. 16, 2020

(65) Prior Publication Data

US 2021/0286418 A1    Sep. 16, 2021

(51) Int. Cl.
| | | |
|---|---|---|
| G06F 1/26 | (2006.01) | |
| H02J 7/00 | (2006.01) | |
| B60R 16/03 | (2006.01) | |
| H01L 23/64 | (2006.01) | |
| H01M 10/42 | (2006.01) | |
| H01M 50/502 | (2021.01) | |

(52) U.S. Cl.
CPC ....... *H01M 10/425* (2013.01); *H01M 50/502* (2021.01); *H02J 7/0063* (2013.01)

(58) Field of Classification Search
CPC ..... G06F 1/26; H01M 50/502; H01M 10/425; B60R 16/03; H01L 23/645; H02J 7/0063
USPC ...................................................... 361/824
See application file for complete search history.

(56) References Cited

U.S. PATENT DOCUMENTS

| | | | | |
|---|---|---|---|---|
| 4,814,631 | A * | 3/1989 | Jackson | B60L 15/04 307/53 |
| 7,183,616 | B2 * | 2/2007 | Bhalla | H01L 24/06 257/E23.079 |
| 7,301,755 | B2 * | 11/2007 | Rodriguez | H05K 7/1432 174/16.3 |
| 8,829,839 | B1 * | 9/2014 | Vrankovic | H02K 11/0094 388/934 |
| 10,369,896 | B2 | 8/2019 | Namuduri et al. | |
| 10,665,398 | B1 * | 5/2020 | Namuduri | H01L 25/072 |
| 11,081,422 | B2 * | 8/2021 | Dede | H01L 23/3735 |
| 2003/0183924 | A1 * | 10/2003 | Bhalla | H01L 24/06 257/723 |
| 2007/0051974 | A1 * | 3/2007 | Azuma | H01L 24/41 257/E23.048 |
| 2008/0284385 | A1 * | 11/2008 | Namuduri | H02M 7/219 363/126 |
| 2014/0042564 | A1 * | 2/2014 | Tsai | H01H 13/88 438/51 |

(Continued)

*Primary Examiner* — Anatoly Vortman
(74) *Attorney, Agent, or Firm* — Quinn IP Law

(57) ABSTRACT

A solid-state switch assembly includes a base plate and an electrically insulating layer affixed to the base plate. First, second, third, and fourth power traces are affixed to the electrically insulating layer. First semiconductor devices are arranged on the first power trace to control power flow between the first power trace and the second power trace, second semiconductor devices are arranged on the second power trace to control power flow between the second power trace and the third power trace, and third semiconductor devices are arranged on the third power trace to control power flow between the third and fourth power traces. A first signal conductor communicates with the first semiconductor devices. A second signal conductor communicates with the second semiconductor devices. A third signal conductor communicates with the third semiconductor devices.

11 Claims, 3 Drawing Sheets

(56) References Cited

U.S. PATENT DOCUMENTS

2018/0152027 A1* 5/2018 Peng .................... H02J 7/00304
2019/0126761 A1* 5/2019 Verbridge ........... H01M 10/441
2021/0135588 A1* 5/2021 Prasad ................ H01L 27/0629

* cited by examiner

SOLID-STATE MULTI-SWITCH DEVICE

INTRODUCTION

On-vehicle battery systems may employ multiple battery packs that are arranged to supply high-voltage DC electrical power to an electrified powertrain. The battery packs may be arranged in parallel to supply electric power to the electrified powertrain for operation, and arranged in series during recharging.

Existing gate driver circuits are designed for inverter applications, consume high power, are bulky, and are not suited for integration for solid-state switches. Solid-state switches cannot absorb high energy during turn-off under shorted or overload conditions if the power source has significant inductance. Therefore, there is a need to develop a low power consumption and compact gate driver and protection circuit for a solid-state switch. Furthermore, there is a need for a switch device that is capable of carrying electric power for electrified powertrain operation and charging, is compact in size, is lightweight, is able to manage temperature, has fast switching speeds, and is quiet.

Summary

The concepts described herein relate to an electronic solid-state switch assembly, including an electronic solid-state switch assembly that may be employed in a high-voltage battery system that includes multiple battery packs. The disclosed switch assembly is intended to be lightweight, with fast switching speed and quiet operation. Further, the disclosed switch assembly may achieve one or more desirable benefits, including continuously carrying at least 400 amperes direct current with a voltage drop of less than one volt; being scalable; having fast fault interruptability; having current limiting in the event of a fault; and having repeatability and reliability.

An electronic solid-state switch assembly (multi-switch device) is described, and includes a base plate and an electrically insulating layer affixed to the base plate. A first power trace is affixed to the electrically insulating layer, wherein the first power trace includes a positive power terminal; a second power trace is affixed to the electrically insulating layer, wherein the second power trace includes a first power node; a third power trace is affixed to the electrically insulating layer, wherein the third power trace includes a second power node; and a fourth power trace is affixed to the electrically insulating layer, wherein the fourth power trace includes a negative power terminal. A first set of power semiconductor devices is arranged on the first power trace to control power flow between the first power trace and the second power trace via a first plurality of electrical bonds, a second set of power semiconductor devices is arranged on the second power trace to control power flow between the second power trace and the third power trace via a second plurality of electrical bonds, and a third set of power semiconductor devices is arranged on the third power trace to control power flow between the third power trace and the fourth power trace via a third plurality of electrical bonds. A first signal conductor is affixed to the electrically insulating layer between the first and second power traces, wherein the first signal conductor is in communication with the first set of power semiconductor devices. A second signal conductor is affixed to the electrically insulating layer between the second and third power traces, wherein the second signal conductor is in communication with the second set of power semiconductor devices. A third signal conductor is affixed to the electrically insulating layer between the third and fourth power traces, wherein the third signal conductor is in communication with the third set of power semiconductor devices.

Another aspect of the disclosure includes the first, second, third, and fourth power traces being electrically conductive planar elements that are electrically isolated on the base plate.

Another aspect of the disclosure includes the first, second, third, and fourth power traces being electrically conductive rectangular planar elements that are arranged in parallel and are electrically isolated on the base plate.

Another aspect of the disclosure includes the electrically conductive planar elements of the first, second, third, and fourth power traces being fabricated from a metallic material that is selected from a group consisting of copper, aluminum and alloys thereof.

Another aspect of the disclosure includes the electrically insulating layer being thermally conductive.

Another aspect of the disclosure includes a heat sink being thermally connected to the base plate.

Another aspect of the disclosure includes each of the power semiconductor devices being configured to block electric power of a magnitude between 650 volts and 1200 volts.

Another aspect of the disclosure includes the electronic solid-state switch assembly being configured to continuously carry at least 400 amperes direct current with a voltage drop of less than one volt when controlled to a conductive state.

Another aspect of the disclosure includes the base plate having a thickness between two millimeters and three millimeters, and the plurality of semiconductor dies being electrically connected to one another in parallel.

Another aspect of the disclosure includes a solder layer being disposed between the base plate and the electrically insulating layer, wherein the electrically insulating layer includes a ceramic material, and wherein the base plate includes copper, aluminum, molybdenum, their alloys or thermally conductive metal matrix composite such as AlSiC or copper graphite foam.

Another aspect of the disclosure includes the electrically conductive trace including a metallic material, wherein the metallic material is selected from a group consisting of copper, aluminum and alloys thereof.

Another aspect of the disclosure includes the first, second and third pluralities of power semiconductor devices being metal-oxide-silicon field-effect transistors (MOSFETs).

Another aspect of the disclosure includes an electronic solid-state switch assembly including a base plate, and an electrically insulating layer affixed to the base plate. A first power trace is affixed to the electrically insulating layer, wherein the first power trace includes a positive power terminal. A second power trace is affixed to the electrically insulating layer, wherein the second power trace includes a first power node. A third power trace is affixed to the electrically insulating layer, wherein the third power trace includes a second power node. A fourth power trace is affixed to the electrically insulating layer, wherein the fourth power trace includes a third power node. A fifth power trace is affixed to the electrically insulating layer, wherein the fifth power trace includes a negative power terminal. A first set of power semiconductor devices is arranged on the first power trace to control power flow between the first power trace and the second power trace via a first plurality of electrical bonds. A second set of power semiconductor devices is arranged on the second power trace to control power flow between the second power trace and the third power trace via a second plurality of electrical bonds. A third set of power semiconductor devices is arranged on the fourth power trace to control power flow between the third power trace and the fourth power trace via a third plurality of electrical bonds. A fourth set of power semiconductor devices is arranged on the fourth power trace to control power flow between the fourth power trace and the fifth power trace via a fourth plurality of electrical bonds. A first signal conductor is affixed to the electrically insulating layer between the first and second power traces, wherein the first signal conductor is in communication with the first set of power semiconductor devices, and a second signal conductor is affixed to the electrically insulating layer between the second and third power traces, wherein the second signal conductor is in communication with the second set of power semiconductor devices. A third signal conductor is affixed to the electrically insulating layer between the third and fourth power traces, wherein the third signal conductor is in communication with the third set of power semiconductor devices. A fourth signal conductor is affixed to the electrically insulating layer between the fourth and fifth power traces, wherein the fourth signal conductor is in communication with the fourth set of power semiconductor devices.

Another aspect of the disclosure includes a reconfigurable battery system, including a high-voltage bus including a positive high-voltage bus and a negative high-voltage bus, a first battery pack and a second battery pack electrically connected between positive high-voltage bus and the negative high-voltage bus, and an electronic solid-state switch assembly, including a first power trace including a positive power terminal, a second power trace including a first power node, a third power trace including a second power node, and a fourth power trace including a negative power terminal. The positive power terminal of the electronic solid-state switch assembly is electrically connected to the positive high-voltage bus. The first power node of the electronic solid-state switch assembly is electrically connected to an anode of the first battery pack. The second power node of the electronic solid-state switch assembly is electrically connected to a cathode of the second battery pack. The negative power terminal of the electronic solid-state switch assembly is electrically connected to the negative high-voltage bus. A cathode of the first battery pack is electrically connected to the negative high-voltage bus. An anode of the second battery pack is electrically connected to the positive high-voltage bus. The electronic solid-state switch assembly includes a base plate, an electrically insulating layer affixed to the base plate, a first set of power semiconductor devices arranged to control power flow between the first power trace and the second power trace, a second set of power semiconductor devices arranged to control power flow between the second power trace and the third power trace, and a third set of power semiconductor devices arranged to control power flow between the third power trace and the fourth power trace.

The above features and advantages, and other features and advantages, of the present teachings are readily apparent from the following detailed description of some of the best modes and other embodiments for carrying out the present teachings, as defined in the appended claims, when taken in connection with the accompanying drawings.

Figure 1:
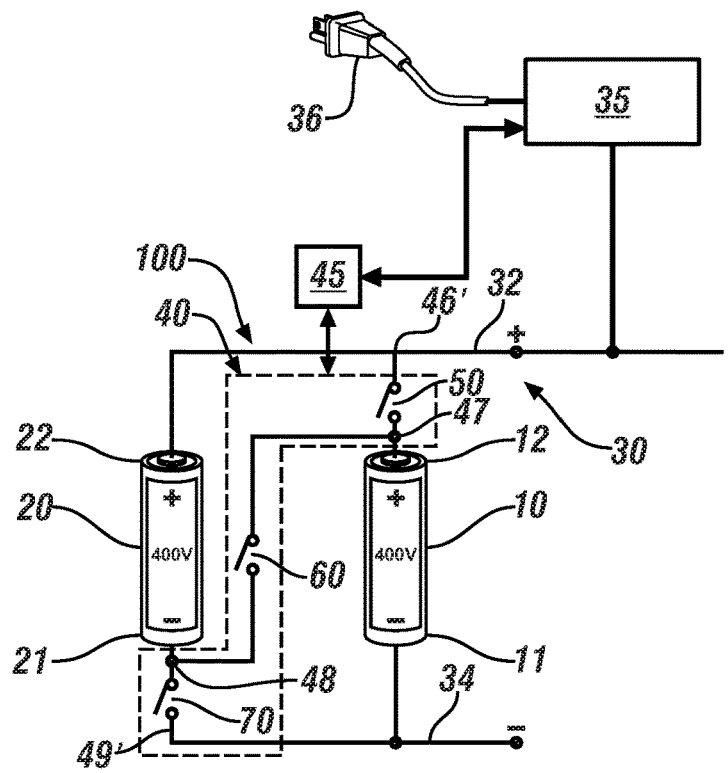
FIG. 1 is a schematic view of a reconfigurable battery system including an electronic solid-state switch assembly, in accordance with the disclosure.

The appended drawings are not necessarily to scale, and may present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail in order to avoid unnecessarily obscuring the disclosure. For purposes of convenience and clarity only, directional terms such as top, bottom, left, right, up, over, above, below, beneath, rear, and front, may be used with respect to the drawings. These and similar directional terms are not to be construed to limit the scope of the disclosure. Furthermore, the disclosure, as illustrated and described herein, may be practiced in the absence of an element that is not specifically disclosed herein.

Embodiments of the present disclosure may be described herein in terms of functional and/or logical block components and various processing steps. It should be appreciated that such block components may be realized by a number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with a number of systems, and that the systems described herein are merely exemplary embodiments of the present disclosure.

For the sake of brevity, techniques related to signal processing, data fusion, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that alternative or additional functional relationships or physical connections may be present in an embodiment of the present disclosure.

FIG. 1 schematically illustrates a reconfigurable battery system 100 that includes a first battery pack 10, a second battery pack 20, and an embodiment of a DC electronic solid-state multi-switch device (multi-switch device) 40. Operation of the reconfigurable battery system 100 is monitored and controlled by a switch controller 45 and/or a vehicle charging controller 35. The reconfigurable battery system 100 is arranged between a positive high-voltage bus (HV+) 32 and a negative high-voltage bus (HV−) 34, which are elements of a high-voltage bus 30. The reconfigurable battery system 100 is deployed to supply electric power to an electrified powertrain system of a vehicle in one embodiment. The positive high-voltage bus (HV+) 32 and the negative high-voltage bus (HV−) 34 are electrically connected to a DC power source (not shown), and electrically connectable to a charge receptacle 36. The first battery pack 10 and the second battery pack 20 are configured as electrochemical devices that are rechargeable and capable of storing electrical energy, such as ultra-capacitors, batteries, battery packs, battery cells, or any combination thereof.

The multi-switch device 40 is arranged between the first and second battery packs 10, 20. The multi-switch device 40 includes a plurality of switches, including, in one embodiment, power semiconductor device S1 50, power semiconductor device S2 60, and power semiconductor device S3 70. The power semiconductor devices S1 50, S2 60, and S3 70 are arranged in series between a first power terminal 46' and a second power terminal 49', with intervening first and second power nodes 47',48', respectively. In one embodiment, and as described herein, the first power terminal 46' connects to HV+32, and the second power terminal 49' connects to HV−34. Activations and deactivations of power semiconductor device S1 50, power semiconductor device S2 60, and power semiconductor device S3 70 are controlled by a switch controller 45. The first power terminal 46' is electrically connected to an anode 22 of the second battery pack 20, and to power semiconductor device S1 50. Power semiconductor device S1 50 is arranged to electrically connect the first power terminal 46' and an anode 12 of the first battery pack 10 at the first power node 47'. Power semiconductor device S3 70 is arranged to electrically connect a cathode 21 of the second battery pack 20 and the second power terminal 49' at the second power node 48'. Power semiconductor device S2 60 is arranged to electrically connect the anode 12 of the first battery pack 10 and the cathode 21 of the second battery pack 20. Cathode 11 of the first battery pack 10 electrically connects to the first power terminal 46', and anode 22 of the second battery pack 20 electrically connects to the first power terminal 46'.

The reconfigurable battery system 100 facilitates a first arrangement wherein power semiconductor device S1 50 and power semiconductor device S3 70 are closed, and power semiconductor device S2 60 is open, resulting in the first and second battery packs 10, 20 being electrically connected in parallel between HV+32 and HV−34. The reconfigurable battery system 100 facilitates a second arrangement wherein power semiconductor device S1 50 and power semiconductor device S3 70 are open, and power semiconductor device S2 60 is closed, resulting in the first and second battery packs 10, 20 being electrically connected in series between HV+32 and HV−34. This may facilitate a fast charging event. The reconfigurable battery system 100 facilitates a third arrangement wherein power semiconductor device S2 60 and power semiconductor device S3 70 are closed, resulting in the first battery pack 10 being isolated and off-line, and the second battery pack 20 being electrically connected between HV+32 and HV−34. This facilitates fault-tolerant operation in the event of a detected fault associated with the first battery pack 10. The reconfigurable battery system 100 facilitates a fourth arrangement wherein power semiconductor device S2 60 and power semiconductor device S3 70 are open, and power semiconductor device S1 50 is closed, resulting in the second battery pack 20 being isolated and off-line, and the first battery pack 10 being electrically connected between HV+32 and HV−34. This facilitates fault-tolerant operation in the event of a detected fault associated with the second battery pack 20.

The power semiconductor devices S1 50, S2 60, and S3 70 are low-loss switching devices. In the present disclosure, the term "low-loss switching device" means a solid state relay having no moving parts; instead, the solid state relay uses the electrical and optical properties of solid state semiconductors to perform its input to output isolation and switching functions. As non-limiting examples, solid state relays include MOS-controlled Thyristors (MCTs), gallium-nitride (GaN) field-effect transistors (FETs), metal-oxide-semiconductor field-effect transistors (MOSFETs), silicon carbide junction field-effect transistors (SiC JFETs), insulated-gate bipolar transistors (IGBTs) or any other suitable low loss device of suitable voltage and current ratings.

The reconfigurable battery system 100 of the present disclosure provides for flexible fast charging of a battery system, such as may be employed on an electrified vehicle, e.g., a hybrid vehicle or an electric vehicle. By employing the reconfigurable battery system 100, charging time may be minimized when connected to a high power direct current (DC) fast charging station (not shown). The voltage of the high-power DC fast charging station may be 800 volts. The charging station includes a charge port capable of supplying a DC voltage or an alternating current (AC) voltage or both to the reconfigurable battery system 100 via the charge receptacle 36. The charge receptacle 36 is configured to receive a charge port to electrically charge the reconfigurable battery system 100, and may receive AC charging power and/or DC charging power. In addition, the charge receptacle 36 may be configured to communicate with the charge station either directly, or through the charge port. As such, the charge receptacle 36 may receive and send communication and port verification signals from the charge port.

Figure 2:
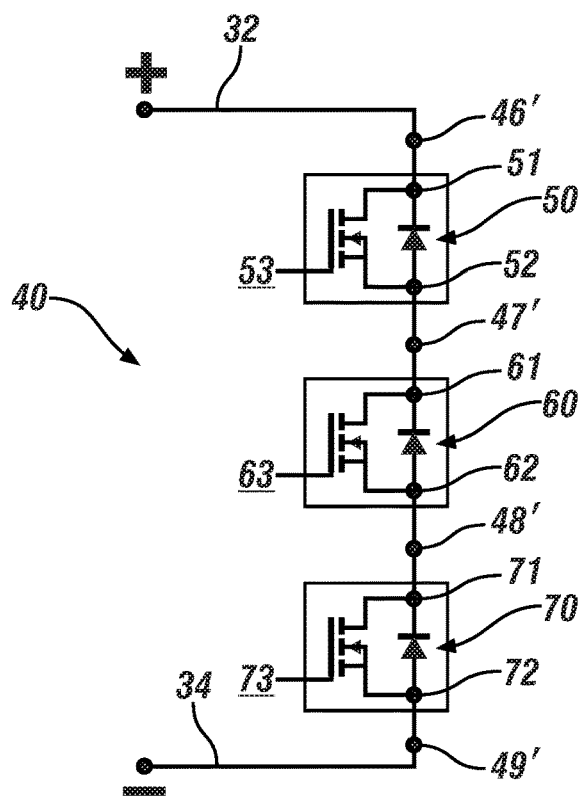
FIG. 2 is a schematic view of one embodiment of the electronic solid-state switch assembly of FIG. 1.
Figure 3:
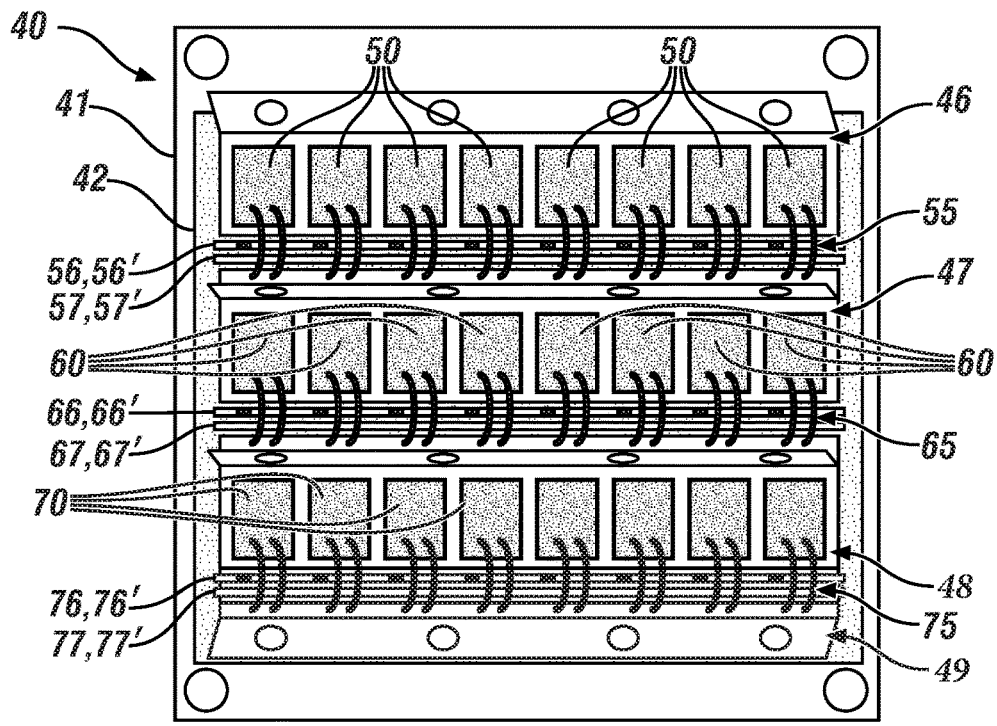
FIG. 3 is a schematic top view of one embodiment of the electronic solid-state switch assembly of FIG. 1.

FIGS. 2 and 3 show an electrical arrangement and a physical layout of the multi-switch device 40, including power semiconductor device S1 50, power semiconductor device S2 60, and power semiconductor device S3 70, which are electrically connected in series between a first power terminal 46' and a second power terminal 49'. When arranged as a MOSFET device, power semiconductor device S1 50 includes a drain 51, source 52, and gate 53; power semiconductor device S2 60 includes a drain 61, source 62, and gate 63; and power semiconductor device S3 70 includes a drain 71, source 72, and gate 73. A first power node 47' is interposed between the power semiconductor device S1 50 and the power semiconductor device S2 60, and a second power node 48' is interposed between the power semiconductor device S2 60 and the power semiconductor device S3 70. In one embodiment and as described with reference to FIGS. 1 and 2, power semiconductor device S1 50 is arranged to electrically connect HV+32 and the anode 12 of the first battery pack 10 at the first power node 47'. Power semiconductor device S3 70 is arranged to electrically connect the cathode 21 of the second battery pack 20 and HV−34 at the second power node 48'. Power semiconductor device S2 60 is arranged to electrically connect the anode 12 of the first battery pack 10 and the cathode 21 of the second battery pack 20. The first power terminal 46' electrically connects to HV+32, and the second power terminal 49' electrically connects to HV−34.

The multi-switch device 40 is contained in a case (not shown) that is configured to retain and encapsulate the hardware and may be wholly or partly made of an electrically insulating and rigid material, such as a rigid polymeric material. Due to the configuration that is described herein, the mass of the multi-switch device 40 does not exceed 400 grams.

With reference to FIGS. 2 and 3, the multi-switch device 40 includes a base plate 41 having mounting holes on opposite sides thereof. The base plate 41 has a maximum thickness BT between two millimeters and three millimeters to minimize the overall size of the multi-switch device 40. Further, the base plate 41 has an essentially planar shape, and therefore a flat configuration. In addition, the base plate 41 may be wholly or partly made of a thermally conductive material, such as a metal or metal matrix composite. For example, the base plate 41 may be wholly or partly made of copper, aluminum, molybdenum or alloys thereof or metal matrix composites such as AlSiC or copper graphite foam, and may be mounted to a heat sink. The base plate 41 may include optimally shaped pin fins.

The multi-switch device 40 includes an electrically insulating layer 42 that is disposed on the base plate 41. In one embodiment, the electrically insulating layer 42 is also thermally conductive. The electrically insulating layer 42 may be fabricated wholly or partially from a ceramic or a polymeric material. Suitable ceramic materials for the electrically insulating layer 42 include, but are not limited to, aluminum oxide ($Al_2O_3$), Aluminum Nitride (AlN), Aluminum Silicon Carbide (AlSiC), Silicon Nitride ($Si_3N_4$), Diamond, Gallium Oxide among others. Polymeric materials may include mylar, Kapton, etc.

The multi-switch device 40 may include a solder layer (not shown) disposed between the base plate 41 and the electrically insulating layer 42 to connect the base plate 41 to the electrically insulating layer 42. The term "solder" means a low-melting alloy, especially one based on lead and tin or (for higher temperatures) on brass or silver, used for joining less fusible metals. The solder layer is directly disposed on the base plate 41 to facilitate and enhance the connection between the solder layer and the base plate 41. Each of the base plate 41, the electrically insulating layer 42, and the solder layer has a planar shape to minimize the size coupled by the multi-switch device 40.

The multi-switch device 40 further includes a metallic sheet (not shown) directly coupled to the electrically insulating layer 42 to form a direct bonded substrate. The direct bonded substrate has a thickness that is between 0.1 millimeter to 0.8 millimeters to minimize the size of the multi-switch device 40. The metallic sheet may be directly bonded to the electrically insulating and thermally conductive layer to form a direct bonded substrate. The metallic sheet may be wholly or partly made of copper, and therefore form a direct bonded copper (DBC) substrate in conjunction with the electrically insulating layer 42. The metallic sheet may be wholly or partly made of an aluminum to form a direct bonded aluminum (DBA) substrate in conjunction of the electrically insulating layer 42. The metallic sheet may be directly coupled (and directly disposed on) the solder layer to enhance the structural integrity of the multi-switch device 40. As such, the metallic sheet is disposed on top of the electrically insulating layer 42 (e.g., ceramic layer). In other words, the metallic sheet is bonded to the electrically insulating layer 42.

The multi-switch device 40 includes a first electrically conductive trace (first power trace) 46, a second electrically conductive trace (second power trace) 47, a third electrically conductive trace (third power trace) 48, and a fourth electrically conductive trace (fourth power trace) 49. The first power trace 46 includes the first power terminal 46', the second power trace 47 includes the first power node 47', the third power trace 48 includes the second power node 48', and the fourth power trace 49 includes the second power terminal 49'. The first power trace 46, the second power trace 47, the third power trace 48, and the fourth power trace 49 are directly disposed on the electrically insulating layer 42 to minimize the size occupied by the multi-switch device 40.

The first power trace 46, the second power trace 47, the third power trace 48, and the fourth power trace 49 are directly disposed on and directly bonded or otherwise affixed to the electrically insulating layer 42 to enhance the structural integrity of the multi-switch device 40. The first power trace 46, the second power trace 47, the third power trace 48, and the fourth power trace 49 each has a planar shape to minimize its size. The first power trace 46, the second power trace 47, the third power trace 48, and the fourth power trace 49 are each wholly or partly made of a metallic material, such as copper or aluminum, or alloys thereof.

The multi-switch device 40 further includes a first gate signal conductor 56 and associated first gate signal terminal 56', a first source signal conductor 57 and associated first source signal terminal 57'; a second gate signal conductor 66 and associated second gate signal terminal 66', a second source signal conductor 67 and associated second source signal terminal 67'; a third gate signal conductor 76 and associated third gate signal terminal 76', and a third source signal conductor 77 and associated third source signal terminal 77'; all of which are directly disposed on the electrically insulating layer 42, are wholly or partly made of a metallic material, such as copper or aluminum, or alloys thereof, and are directly bonded to the electrically insulating layer 42 (e.g., ceramic layer).

The control inputs carried through the signal conductors 56, 57, 66, 67, 76, 77 draw near zero power (i.e., less than 0.5 watts) to keep the multi-switch device 40 in an ON state or an OFF state.

The multi-switch device 40 includes a plurality of power semiconductor devices, including a first set of power semiconductor devices 50, a second set of power semiconductor devices 60, and a third set of power semiconductor devices 70. Each of the power semiconductor devices is configured as a metal-oxide-semiconductor field-effect transistor (MOSFET) in one embodiment, and includes a source terminal S, a gate terminal G, and a drain terminal D. This includes the first set of power semiconductor devices 50 each having a source terminal S52, a gate terminal G 53, and a drain terminal D 51. This includes the second set of power semiconductor devices 60 each having a source terminal S62, a gate terminal G 63, and a drain terminal D 61. This includes the third set of power semiconductor devices 50 each having a source terminal S72, a gate terminal G 73, and a drain terminal D 71. Each of the power semiconductor devices has a minimum area of twenty square millimeters to share and carry 400 A current, in one embodiment.

The first set of power semiconductor devices 50 is disposed directly on the first power trace 46 to facilitate or control the flow of electricity between the first power trace 46 and the second power trace 47 via first electrical bonds 55.

The second set of power semiconductor devices 60 is disposed directly on the second power trace 47 to facilitate or control the flow of electricity between the second power trace 47 and the third power trace 48 via second electrical bonds 65.

The third set of power semiconductor devices 70 is disposed directly on the third power trace 48 to facilitate or control the flow of electricity between the third power trace 48 and the fourth power trace 49 via third electrical bonds 75.

Each of the first, second and third electrical bonds 55, 65, 75 may be fabricated from a single or multiple high current aluminum or copper ribbon bond(s) or a foil bond to minimize parasitic inductance and resistance.

The depicted embodiment illustrates a quantity of eight of the first set of power semiconductor devices 50 that are arranged in parallel, a quantity of eight of the second power semiconductor devices 60 that are arranged in parallel, and a quantity of eight of the third set of power semiconductor devices 70 that are arranged in parallel, the multi-switch device 40 may include between four and sixteen of each, with each having a voltage rating from 650 volts to 1200 volts) to carry electrical current, thus enhancing scalability.

Each of the power semiconductor devices includes a semiconductor material, such as silicon, silicon carbide, gallium oxide, and gallium nitride, graphene, or diamond.

The power semiconductor devices are arranged in a predetermined pattern to maintain substantially equal current and temperature distribution. The spacing and terminal location is selected to maintain substantially equal current and temperature distribution therebetween. Each of the power semiconductor devices has a specific ON resistance that is less than 3.5 to 4.5 m-$\Omega$cm$^2$ in one embodiment. The placement of the power semiconductor devices and the pattern of the direct bonded substrate is selected to achieve equal current distribution and low parasitic inductance. The multi-switch device 40 may include a plurality of damping resistors each electrically connected to the gate terminal of a respective one of the power semiconductor devices in series to prevent or at least minimize power oscillations. The power semiconductor devices are electrically connected in parallel to achieve scalable current rating (e.g., multiple of 100 A), and the multi-switch device 40 includes the electrically insulating layer 42 (e.g., ceramic layer) with predetermined thermal stack height and pattern. For optimal thermal management, spacing P between adjacent power semiconductor devices is greater than 1 millimeter and less than 3 millimeters. The term "spacing" means a distance between the edge of one of the power semiconductor devices and a closest edge of the adjacent one of the power semiconductor devices.

The power semiconductor devices may be capable of blocking between 650V to 1200V (e.g., at least 1200V) DC, and may have different stack lengths. As such, the multi-switch device 40 is capable of carrying a scalable current continuously in the ON state with a low ON state resistance. The multi-switch device 40 includes power semiconductor devices that are electrically connected in parallel for scalability in a minimum package size with an isolation resistance that is greater than 50 Mohms and different stack lengths. The electrically insulating layer 42 (e.g., ceramic layer) may have predetermined thermal stack heights and pattern to provide required thermal capabilities.

The gate terminal 53 of each of the first power semiconductor devices 50 is electrically connected to the first gate signal terminal 56' via the first gate signal conductor 56, the gate terminal 63 of each of the second power semiconductor devices 60 is electrically connected to the second gate signal terminal 66' via the second gate signal conductor 66, and the gate terminal 73 of each of the third power semiconductor devices 70 is electrically connected to the third gate signal terminal 76' via the third gate signal conductor 76.

The first, second, and third gate signal terminals 56',66', and 76' are in communication with the switch controller 45 (shown with reference to FIG. 1). The multi-switch device 40 may optionally include one or more thermistors (not shown) that are directly connected to the direct bonded substrate to measure a temperature of the multi-switch device 40.

The multi-switch device 40 having an OFF state and an ON state. Due to its configuration, the multi-switch device 40 is capable of blocking at least 650 to 1200 volts in a single direction during the OFF state. Due to its configuration, the multi-switch device 40 continuously carries at least 400 amperes direct current during the ON state with a voltage drop of less than 1V. Due to its configuration, the multi-switch device 40 may have a mass that is equal to or less than 400 grams and switching on/off times that are less than 10 microseconds. Due to its configuration, the multi-switch device 40 has a maximum width of 55 to 65 millimeters, a maximum length of 65 millimeters, and a maximum height of 25 millimeters, thereby minimizing the size of the multi-switch device 40. Due to the configuration, the multi-switch device 40 has an isolation resistance that is greater than 50 megaohms (M$\Omega$). The concepts provide an architecture that includes a layout of power semiconductor devices in such a fashion that it functionally works as three power semiconductor devices but under a single housing with only the minimum required four power terminals thus saving packaging space and cost.

Figure 4:
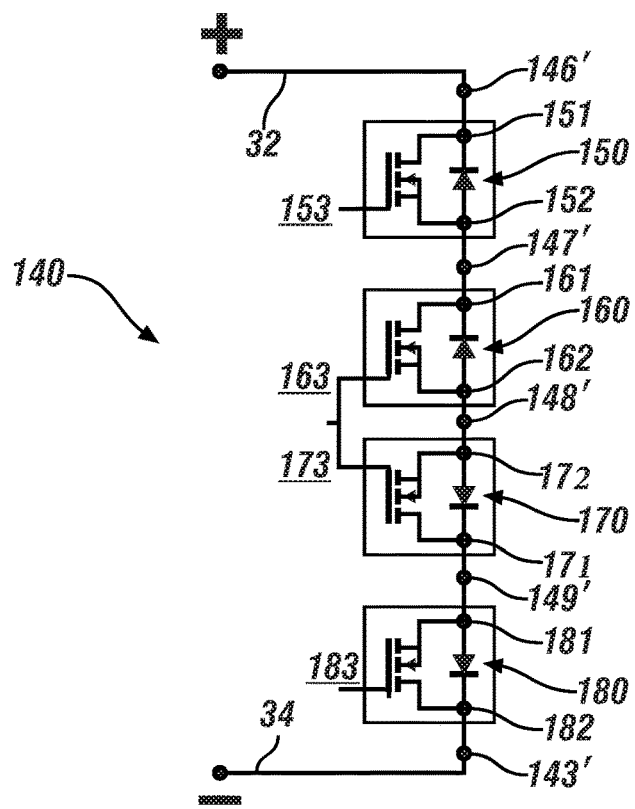
FIG. 4 is a schematic view of a second embodiment of the electronic solid-state switch assembly of FIG. 1.
Figure 5:
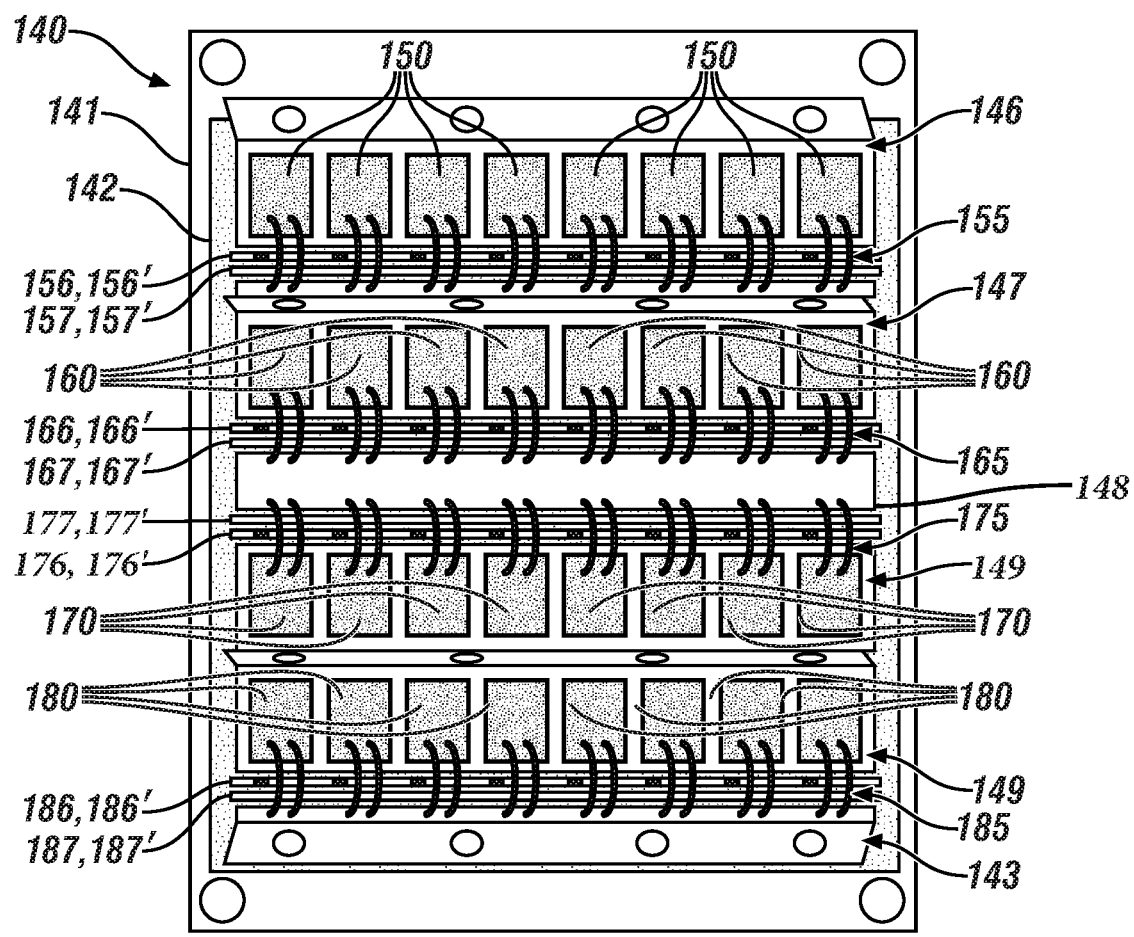
FIG. 5 is a schematic top view of a second embodiment of the electronic solid-state switch assembly of FIG. 1.

FIGS. 4 and 5 show an electrical arrangement and a physical layout of another embodiment of a multi-switch device 140, including power semiconductor device S1 150, power semiconductor device S2 160, power semiconductor device S3 170, and power semiconductor device S4 180, which are electrically connected in series between a first power terminal 146' and a second power terminal 143'. When arranged as a MOSFET device, power semiconductor device S1 150 includes a drain 151, source 152, and gate 153; power semiconductor device S2 160 includes a drain 161, source 162, and gate 163; power semiconductor device S3 170 includes a drain 171, source 172, and gate 173, and power semiconductor device S4 180 includes a drain 181, source 182, and gate 183. A first power node 147' is interposed between the power semiconductor device S1 150 and the power semiconductor device S2 160, a second power node 148' is interposed between the power semiconductor device S2 160 and the power semiconductor device S3 170, and a third power node 149' is interposed between the power semiconductor device S3 170 and the power semiconductor device S4 180.

When the multi-switch device 140 is applied to the reconfigurable battery system 100 that is described with reference to FIG. 1 and FIG. 4, the power transistor S1 150 is arranged to electrically connect HV+32 and the anode 12 of the first battery pack 10 at the first power node 147'. Power transistor S4 180 is arranged to electrically connect the cathode 21 of the second battery pack 20 and HV−34 at the third power node 149'. Power transistor S2 160 and power transistor S3 170 are arranged to electrically connect the anode 12 of the first battery pack 10 and the cathode 21 of the second battery pack 20. The first power terminal 146' electrically connects to HV+32, and the second power terminal 143' electrically connects to HV−34.

This arrangement provides bi-directional current blocking via power semiconductor devices S2 160 and S3 170 during series charging of the first and second battery packs 10 and 20.

The multi-switch device 140 is contained in a case (not shown) that is configured to retain and encapsulate the hardware and may be wholly or partly made of an electrically insulating and rigid material, such as a rigid polymeric material.

Referring again to FIGS. 4 and 5, the multi-switch device 140 includes a base plate 141 having mounting holes on opposite sides thereof. The base plate 141 has a maximum thickness BT between two millimeters and three millimeters to minimize the overall size of the multi-switch device 140. Further, the base plate 141 has an essentially planar shape, and therefore a flat configuration. In addition, the base plate 141 may be wholly or partly made of a thermally conductive material, such as a metal or metal matrix composite. For example, the base plate 141 may be wholly or partly made of copper, aluminum, molybdenum or alloys thereof or metal matrix composites such as AlSiC or copper foam, and may be mounted to a heat sink. The base plate 141 may optimally have pin fins.

The multi-switch device 140 includes an electrically insulating layer 142 that is disposed on the base plate 141. In one embodiment, the electrically insulating layer 142 is also thermally conductive. The electrically insulating layer 142 may be fabricated wholly or partially from a ceramic material. Suitable ceramic materials for the electrically insulating layer 142 include, but are not limited to, aluminum oxide ($Al_2O_3$), Aluminum Nitride (AlN), Aluminum Silicon Carbide (AlSiC), Silicon Nitride ($Si_3N_4$), Diamond, Gallium Oxide among others.

The multi-switch device 140 may include a solder layer (not shown) disposed between the base plate 141 and the electrically insulating layer 142 to connect the base plate 141 to the electrically insulating layer 142. The term "solder" means a low-melting alloy, especially one based on lead and tin or (for higher temperatures) on brass or silver, used for joining less fusible metals. The solder layer is directly disposed on the base plate 141 to facilitate and enhance the connection between the solder layer and the base plate 141. Each of the base plate 141, the electrically insulating layer 142, and the solder layer has a planar shape to minimize the size coupled by the multi-switch device 140.

The multi-switch device 140 further includes a metallic sheet (not shown) directly coupled to the electrically insulating layer 142 to form a direct bonded substrate. The direct bonded substrate has a thickness that is between 0.1 millimeter to 0.8 millimeters to minimize the size of the multi-switch device 140. The metallic sheet may be directly bonded to the electrically insulating and thermally conductive layer to form a direct bonded substrate. The metallic sheet may be wholly or partly made of copper and, and therefore form a direct bonded copper (DBC) substrates in conjunction with the electrically insulating layer 142. The metallic sheet may be wholly or partly made of an aluminum to form a direct bonded aluminum (DBA) substrate in conjunction of the electrically insulating layer 142. The metallic sheet may be directly coupled (and directly disposed on) the solder layer to enhance the structural integrity of the multi-switch device 140. As such, the metallic sheet is disposed between the solder layer and the electrically insulating layer 142 (e.g., ceramic layer). In other words, the metallic sheet is sandwiched between the solder layer and the electrically insulating layer 142.

The multi-switch device 140 includes a first electrically conductive trace (first power trace) 146, a second electrically conductive trace (second power trace) 147, a third electrically conductive trace (third power trace) 148, a fourth electrically conductive trace (fourth power trace) 149, and a fifth electrically conductive trace (fifth power trace) 143. The first power trace 146 includes the first power terminal 146', the second power trace 147 includes the first power node 147', the third power trace 148 includes the second power node 148', the fourth power trace 149 includes the third power node 149', and the fifth power trace 143 includes the second power terminal 143'. The first power trace 146, the second power trace 147, the third power trace 148, the fourth power trace 149, and the fifth power trace 143 are directly disposed on the electrically insulating layer 142 to minimize the size occupied by the multi-switch device 140.

The first power trace 146, the second power trace 147, the third power trace 148, the fourth power trace 149, and the fifth power trace 143 are directly disposed on and directly bonded or otherwise affixed to the electrically insulating layer 142 to enhance the structural integrity of the multi-switch device 140. The first power trace 146, the second power trace 147, the third power trace 148, the fourth power trace 149, and the fifth power trace 143 each has a planar shape to minimize its size. The first power trace 146, the second power trace 147, the third power trace 148, the fourth power trace 149, and the fifth power trace 143 are each wholly or partly made of a metallic material, such as copper or aluminum, or alloys thereof.

The multi-switch device 140 further includes a first gate signal conductor 156 and associated first gate signal terminal 156', a first source signal conductor 157 and associated first source signal terminal 157'; a second gate signal conductor 166 and associated second gate signal terminal 166', a second source signal conductor 167 and associated second source signal terminal 167'; a third gate signal conductor 176 and associated third gate signal terminal 176', and a third source signal conductor 177 and associated third source signal terminal 177'; and fourth gate signal conductor 186 and associated fourth gate signal terminal 186', a fourth source signal conductor 187 and associated fourth source signal terminal 187' all of which are directly disposed on the electrically insulating layer 142, are wholly or partly made of a metallic material, such as copper or aluminum, and are directly bonded to the electrically insulating layer 142 (e.g., ceramic layer).

The control inputs carried through the signal conductors 120 draw near zero power (i.e., less than 0.5 watts) to keep to the multi-switch device 140 in an ON state or an OFF state.

The multi-switch device 140 includes a plurality of power semiconductor devices, including a first set of power semiconductor devices 150, a second set of power semiconductor devices 160, a third set of power semiconductor devices 170, and a fourth set of power semiconductor devices 180. Each of the power semiconductor devices is configured as a metal-oxide-semiconductor field-effect transistor (MOSFET) in one embodiment, and includes a source terminal S, a gate terminal G, and a drain terminal D. This includes the first set of power semiconductor devices 150 each having a source terminal S152, a gate terminal G153, and a drain terminal D151. This includes the second set of power semiconductor devices 160 each having a source terminal S162, a gate terminal G163, and a drain terminal D161. This includes the third set of power semiconductor devices 150 each having a source terminal S172, a gate terminal G173, and a drain terminal D171. This includes the fourth set of power semiconductor devices 180 each having a source terminal S182, a gate terminal G 183, and a drain terminal D 181. Each of the power semiconductor devices has a minimum area of twenty square millimeters to share and carry 1400 A current, in one embodiment.

The first set of power semiconductor devices 150 is disposed directly on the first power trace 146 to facilitate or control the flow of electricity between the first power trace 146 and the second power trace 147 via first electrical bonds 155.

The second set of power semiconductor devices 160 is disposed directly on the second power trace 147 to facilitate or control the flow of electricity between the second power trace 147 and the third power trace 148 via second electrical bonds 165.

The third set of power semiconductor devices 170 is disposed directly on the third power trace 148 to facilitate or control the flow of electricity between the third power trace 148 and the fourth power trace 149 via third electrical bonds 175.

The fourth set of power semiconductor devices 180 is disposed directly on the fourth power trace 149 to facilitate or control the flow of electricity between the fourth power trace 149 and the fifth power trace 143 via fourth electrical bonds 185.

Each of the first, second, third, and fourth electrical bonds 155, 165, 175, and 185 may be fabricated from a high current aluminum or copper ribbon bond or a foil bond to minimize parasitic inductance and resistance.

The depicted embodiment illustrates a quantity of eight of the first set of power semiconductor devices 150 that are arranged in parallel, a quantity of eight of the second power semiconductor devices 160 that are arranged in parallel, a quantity of eight of the third set of power semiconductor devices 170 that are arranged in parallel, and a quantity of eight of the fourth set of power semiconductor devices 180 that are arranged in parallel the multi-switch device 140 may include between four and sixteen of each, with each having a voltage rating from 650 volts to 1200 volts) to carry electrical current, thus enhancing scalability.

The concepts provide an architecture that includes a layout of power semiconductor devices in such a fashion that it functionally works as three power semiconductor devices but under a single housing with only the minimum required four terminals thus saving packaging space and cost.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. An electronic solid-state switch assembly, comprising:
    a base plate;
    an electrically insulating layer affixed to the base plate;
    a first power trace affixed to the electrically insulating layer, wherein the first power trace includes a positive power terminal;
    a second power trace affixed to the electrically insulating layer, wherein the second power trace includes a first power node;
    a third power trace affixed to the electrically insulating layer, wherein the third power trace includes a second power node;
    a fourth power trace affixed to the electrically insulating layer, wherein the fourth power trace includes a negative power terminal;
    a first set of power semiconductor devices arranged on the first power trace to control power flow between the first power trace and the second power trace via a first plurality of electrical bonds;
    a second set of power semiconductor devices arranged on the second power trace to control power flow between the second power trace and the third power trace via a second plurality of electrical bonds;
    a third set of power semiconductor devices arranged on the third power trace to control power flow between the third power trace and the fourth power trace via a third plurality of electrical bonds;
    a first signal conductor affixed to the electrically insulating layer between the first and second power traces, wherein the first signal conductor is in communication with the first set of power semiconductor devices;
    a second signal conductor affixed to the electrically insulating layer between the second and third power traces, wherein the second signal conductor is in communication with the second set of power semiconductor devices; and
    a third signal conductor affixed to the electrically insulating layer between the third and fourth power traces, wherein the third signal conductor is in communication with the third set of power semiconductor devices.

2. The electronic solid-state switch assembly of claim 1, wherein the first, second, third, and fourth power traces comprise electrically conductive planar elements that are electrically isolated on the base plate.

3. The electronic solid-state switch assembly of claim 2, wherein the first, second, third, and fourth power traces further comprise electrically conductive rectangular planar elements that are arranged in parallel and are electrically isolated on the base plate.

4. The electronic solid-state switch assembly of claim 2, wherein the electrically conductive planar elements of the first, second, third, and fourth power traces are fabricated from a metallic material that is selected from a group consisting of copper, aluminum and alloys thereof.

5. The electronic solid-state switch assembly of claim 1, wherein the electrically insulating layer is thermally conductive.

6. The electronic solid-state switch assembly of claim 1, further comprising a heat sink being thermally connected to the base plate.

7. The electronic solid-state switch assembly of claim 1, wherein each of the power semiconductor devices of the first, second, and third sets of power semiconductor devices is configured to block electric power of a magnitude of at least 650 volts to 1200 volts.

8. The electronic solid-state switch assembly of claim 1, wherein the electronic solid-state switch assembly is configured to continuously carry at least 400 amperes direct current with a voltage drop of less than one volt when controlled to a conductive state.

9. The electronic solid-state switch assembly of claim 1, wherein the base plate has a thickness between two millimeters and three millimeters, the first set of power semiconductor devices arranged on the first power trace are electrically connected to one another in parallel, the second set of power semiconductor devices arranged on the second power trace are electrically connected to one another in parallel, and the the third set of power semiconductor devices arranged on the third power trace are electrically connected to one another in parallel.

10. The electronic solid-state switch assembly of claim 1, further comprising a solder layer disposed between the base plate and the electrically insulating layer, wherein the electrically insulating layer includes a ceramic material, and wherein the base plate includes copper.

11. The electronic solid-state switch assembly of claim 1, wherein the first, second and third sets of power semiconductor devices comprise metal-oxide-silicon field-effect transistor devices (MOSFETs).

* * * * *